(12) United States Patent
Mai

(10) Patent No.: US 7,616,142 B1
(45) Date of Patent: Nov. 10, 2009

(54) SIGMA-DELTA MODULATED ANALOG-TO-DIGITAL CONVERTER HAVING A CHANGEABLE COEFFICIENT

(75) Inventor: Rifeng Mai, Sunnyvale, CA (US)

(73) Assignee: Marvell International Ltd. (BM)

( * ) Notice: Subject to any disclaimer, the term of this patent is extended or adjusted under 35 U.S.C. 154(b) by 3 days.

(21) Appl. No.: 11/786,086

(22) Filed: Apr. 9, 2007

Related U.S. Application Data

(60) Provisional application No. 60/795,622, filed on Apr. 27, 2006.

(51) Int. Cl.
*H03M 3/00* (2006.01)
(52) U.S. Cl. ........................... 341/143; 341/155
(58) Field of Classification Search .......... 341/140–170
See application file for complete search history.

(56) References Cited

U.S. PATENT DOCUMENTS

| | | | | |
|---|---|---|---|---|
| 6,064,326 A | * | 5/2000 | Krone et al. | 341/143 |
| 6,141,671 A | * | 10/2000 | Adams et al. | 708/313 |
| 6,384,761 B1 | * | 5/2002 | Melanson | 341/143 |
| 6,700,519 B2 | * | 3/2004 | Yamamoto | 341/143 |
| 7,094,036 B2 | * | 8/2006 | Mennie et al. | 417/53 |
| 7,183,956 B1 | * | 2/2007 | Hinrichs et al. | 341/143 |
| 7,193,546 B1 | * | 3/2007 | Melanson | 341/143 |
| 7,215,270 B1 | * | 5/2007 | Kozak et al. | 341/143 |
| 7,221,302 B1 | * | 5/2007 | Melanson | 341/143 |
| 2006/0164272 A1 | * | 7/2006 | Philips et al. | 341/143 |

* cited by examiner

*Primary Examiner*—Lam T Mai

(57) ABSTRACT

A sigma-delta modulated analog-to-digital converter having an integrator with a first changeable coefficient and/or having an excess loop-delay circuit also having a second changeable coefficient. The changeable coefficients enable the converter to account for noise mixed with the input signal, circuit non-linearities, and component variations.

37 Claims, 13 Drawing Sheets

SIGMA-DELTA MODULATED ANALOG-TO-DIGITAL CONVERTER HAVING A CHANGEABLE COEFFICIENT

CROSS-REFERENCE TO RELATED APPLICATION

This application claims the benefit of U.S. Provisional Application No. 60/795,622, filed Apr. 27, 2006, which is hereby incorporated by reference.

TECHNICAL FIELD

The present disclosure relates to analog-to-digital converters. Specifically, the disclosure relates to improving the performance of sigma-delta modulated analog-to-digital converters.

BACKGROUND

There are two basic techniques for converting an analog signal into a digital signal: open loop and feedback. An open loop analog-to-digital (A/D) converter generates a digital signal directly in response to an analog input signal. The quality of an open loop A/D converter depends upon several factors, including sampling rate, quantization error, aliasing, and component matching.

A sigma-delta A/D converter ($\Sigma\Delta$ A/D converter) is a feedback type of converter. The $\Sigma\Delta$ A/D converter has a $\Sigma\Delta$ modulator that uses over-sampling (having a high sampling rate; at least above the Nyquist rate) and filtering to develop a high signal-to-noise-plus-distortion ratio (SNDR) in the signal band, and achieves high resolution by precise timing.

A $\Sigma\Delta$ A/D converter typically includes a $\Sigma\Delta$ modulator having a quantizer and a decimator. A $\Sigma\Delta$ modulator processes an analog signal through one or more cascaded integration stages. A weighted feedback (or feed-forward) signal is subtracted from the analog signal between integration stages. The signal difference, also known as an error signal, represents the original analog signal. For example, if the error signal is consecutively positive, then it may be inferred that the input signal is rising rapidly. After the last integrator, the error signal is quantized and filtered to form a digital output signal.

The feedback technique provides a $\Sigma\Delta$ A/D converter with error correction capability under most circumstances. As is the case with most linear circuits, the performance of a $\Sigma\Delta$ A/D converter is affected by circuit noise and dependent on timing variations. For example, external sources may add noise to an input signal, and thereby escalate signal peaking. An escalated input signal may be too large for an integrator in the analog-to-digital converter and the higher amplitudes at the integrator output may be cut-off, the result may be signal distortion and the A/D converter may provide an inaccurate or poor digital output signal. Component variations also contribute to noise and may also lead to decreased performance. In addition, circuit non-linearities cause delay and decrease the performance of the $\Sigma\Delta$ A/D loop. It would be desirable to reduce the effects of noise and component variations in $\Sigma\Delta$ A/D converters. It would also be desirable to compensate for loop delay caused by circuit non-linearities.

SUMMARY

By way of introduction, the embodiments described below provide a sigma-delta modulated analog-to-digital converter which may have an enhanced integrator, an excess loop-delay circuit, or both. The enhanced integrator and the excess loop-delay circuit have changeable coefficients, providing the analog-to-digital converter with the ability to account for noise mixed with the input signal, circuit non-linearities, and component variations.

According to a first aspect of the invention, a sigma-delta modulated analog-to-digital converter has an enhanced integrator having a changeable coefficient. The coefficient is controlled by a selectable coefficient signal provided by a processor. The enhanced integrator may comprise an inverting integrator having a first input resistor and a first feedback capacitor. A switch responsive to the selectable coefficient signal may connect a second feedback capacitor in parallel with a first feedback capacitor, thereby changing the coefficient and adjusting the output of the first integrator.

According to another aspect, a method is disclosed to automatically adjust the performance of a sigma-delta modulated analog-to-digital converter. The method includes setting a first integrator coefficient of a sigma-delta modulator to a first value, and providing a signal for automatically adjusting the first integrator coefficient to a second value in response to a determination that the first integrator output waveform is clipped.

According to another aspect, a sigma-delta modulated analog-to-digital converter has a loop-delay compensation circuit having a changeable coefficient. A processor generates a selectable signal that corresponds to a coefficient value.

According to another aspect, a method is disclosed to automatically adjust the performance of a sigma-delta modulated analog-to-digital converter. The method includes determining a step response of the analog-to-digital converter and associating the step response with one of at least two predetermined and non-overlapping loop-delay intervals. A loop-delay compensation circuit coefficient is set based upon the step response and/or corresponding loop-delay interval.

In yet another aspect, a sigma-delta modulated analog-to-digital converter has a loop-delay compensation circuit having a changeable coefficient. A processor sets the coefficient to a first value and determines a first performance aspect of the analog-to-digital converter. The processor sets the coefficient to a second value and determines a second performance aspect of the analog-to-digital converter. The loop-delay compensation circuit coefficient is set to the value that corresponds to one of the performance aspects. The processor may set additional coefficient values to determine additional performance aspects.

According to an additional aspect, a method is disclosed to automatically adjust the performance of a sigma-delta modulated analog-to-digital converter. The method includes setting a loop-delay compensation circuit coefficient to different values and, in turn, determining a performance aspect of the analog-to-digital converter. The method further includes setting the loop-delay compensation circuit coefficient to a value that provides a selected performance aspect for operation.

According to yet another aspect, a sigma-delta modulated analog-to-digital converter has a first integrator having a changeable coefficient and means for generating a coefficient signal to set the changeable coefficient to one of at least a first or a second value.

According to another aspect, a sigma delta modulated analog-to-digital converter has a first integrator having a changeable coefficient and means for selecting a first integrator coefficient value in response to a determination of whether a first integrator output waveform is clipped.

According to another aspect, a sigma-delta modulated analog-to-digital converter has means for measuring the step response to determine a loop-delay, and means for compensating for the loop-delay.

According to another aspect, a sigma-delta modulated analog-to-digital converter has means for determining a performance characteristic of the analog-to-digital converter and means for adjusting the performance characteristic.

According to an additional aspect, a sigma-delta modulated analog-to-digital converter has a first integrator, a loop-delay compensator circuit, means for setting a first integrator coefficient to one of at least two values, and means for setting a loop-delay compensator coefficient to one of at least two loop-delay values.

According to a further aspect, a computer readable medium has processor executable instructions to cause a processor to do one or more of the following: receive, determine and/or communicate one or more signal(s) for use in selecting, for a sigma-delta modulated analog-to-digital converter, a first coefficient value for an integrator and/or a second coefficient value for a loop-delay compensator; adjust the first coefficient value if the integrator output waveform is clipped; measure a step response of the sigma-delta modulated analog-to-digital converter and associate the step response with one of at least two predetermined and non-overlapping delay intervals; and set the second coefficient value based upon an associated delay interval.

According to yet another aspect, a computer readable medium has processor executable instructions for selecting a coefficient of a loop-delay compensation circuit. The instructions may include providing an output signal to open loop a sigma-delta modulated analog-to-digital converter circuit, providing a step signal at time t0, receiving a response signal at time t1, measuring a time delay between t0 and t1, designating the measured time delay as a circuit delay, and correlating the circuit delay to within one of four predetermined time delay intervals, each having an associated loop-delay compensation circuit coefficient value.

According to another aspect, a computer readable medium has processor executable instructions for changing the value of a loop-delay compensation circuit coefficient while determining two or more signal-to-noise-plus-distortion ratios, and setting the loop-delay compensation circuit coefficient to a value having the highest corresponding signal-to-noise-plus-distortion ratio.

According to yet another aspect, a computer readable medium has processor executable instructions for providing to a loop-delay compensator circuit two loop-delay compensator coefficient values in turn, determining the signal-to-noise-plus-distortion-ratio for both of the coefficient values, and retrieving the coefficient value that corresponds to the higher signal-to-noise-plus-distortion ratio.

According to another aspect, a computer readable medium has processor executable instructions for setting a sigma-delta modulator first integrator coefficient to a first value, providing a signal for automatically adjusting the first integrator coefficient to a second value in response to a determination that a first integrator output waveform is clipped, measuring a step response of the analog-to-digital converter, associating the measured step response with one of at least two predetermined and non-overlapping delay intervals, and setting a loop-delay compensation circuit coefficient based upon the associated delay interval.

Other preferred embodiments are provided, and each of the preferred embodiments described herein can be used alone or in combination with one another.

The preferred embodiments will now be described with reference to the attached drawings.

DETAILED DESCRIPTION OF THE PRESENTLY PREFERRED EMBODIMENTS

Figure 1:
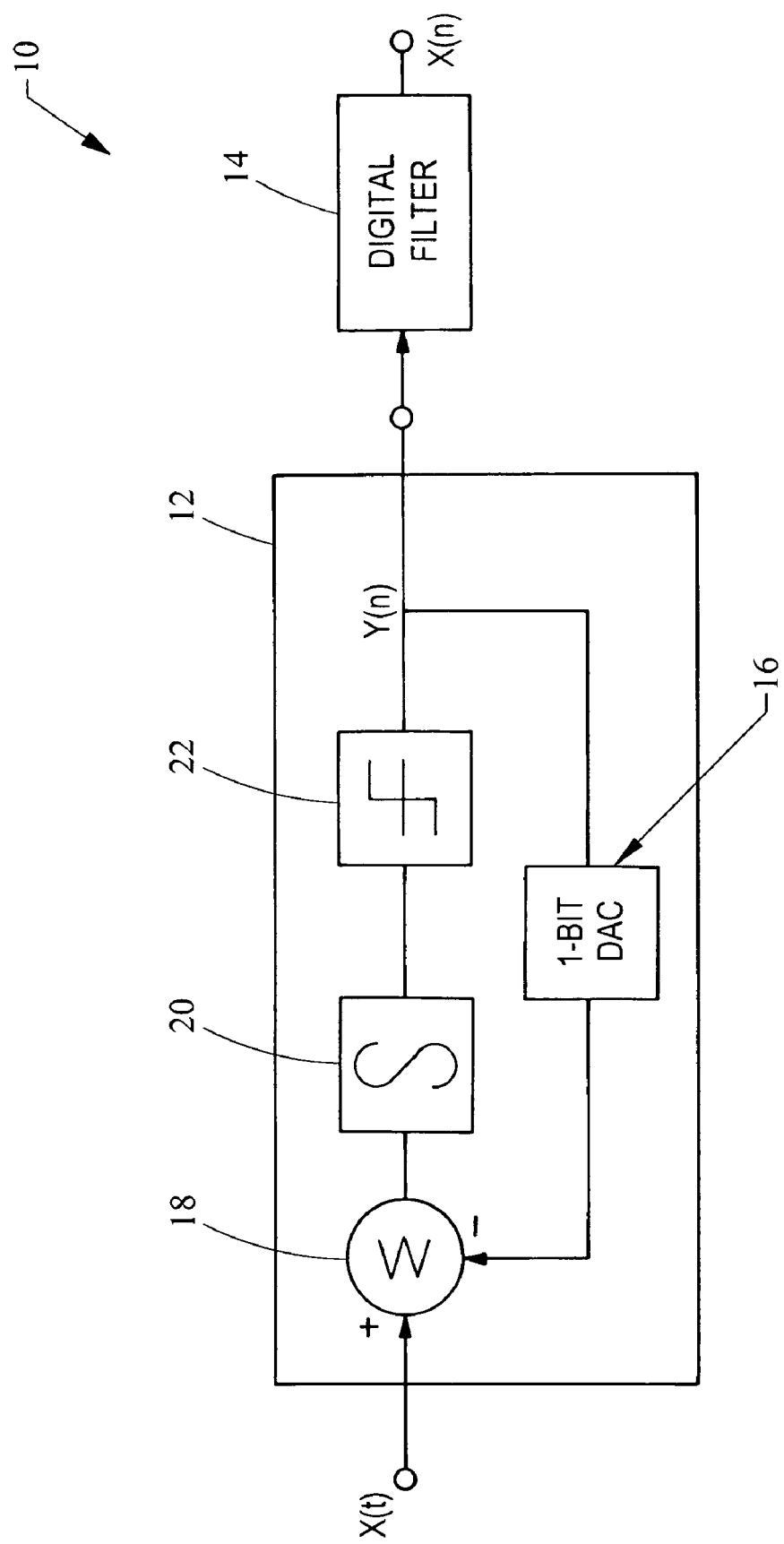
FIG. 1 is a prior art first order $\Sigma\Delta$ A/D converter.

As shown in FIG. 1 (prior art), the fundamental components of a generic A/D converter 10 using the $\Sigma\Delta$ modulation technique include a $\Sigma\Delta$ modulator 12 and a digital filter 14.

The $\Sigma\Delta$ modulator 12 first receives the input voltage x(t), and sums it with the output of a feedback digital-to-analog converter (DAC) 16. This summing can be accomplished by means of a switched capacitor circuit which accumulates charge onto a capacitor summing node 18. An integrator 20 then adds the output of this summing node to a value it has stored from the previous integration step. A quantizer 22 outputs a logic "one" if the integrator 20 output is greater than or equal to zero volts and a logic "zero" otherwise. The feedback voltage from the DAC 16 tries to keep the integrator output at zero by making the "ones" and "zeros" output of the quantizer 22 equal to the analog input.

The digital filter 14 receives the one-bit high-speed digital output y(n) from the ΣΔ modulator 12 and converts the high-speed digital output y(n) to a slower stream of multi-bit samples x(n).

Figure 2:
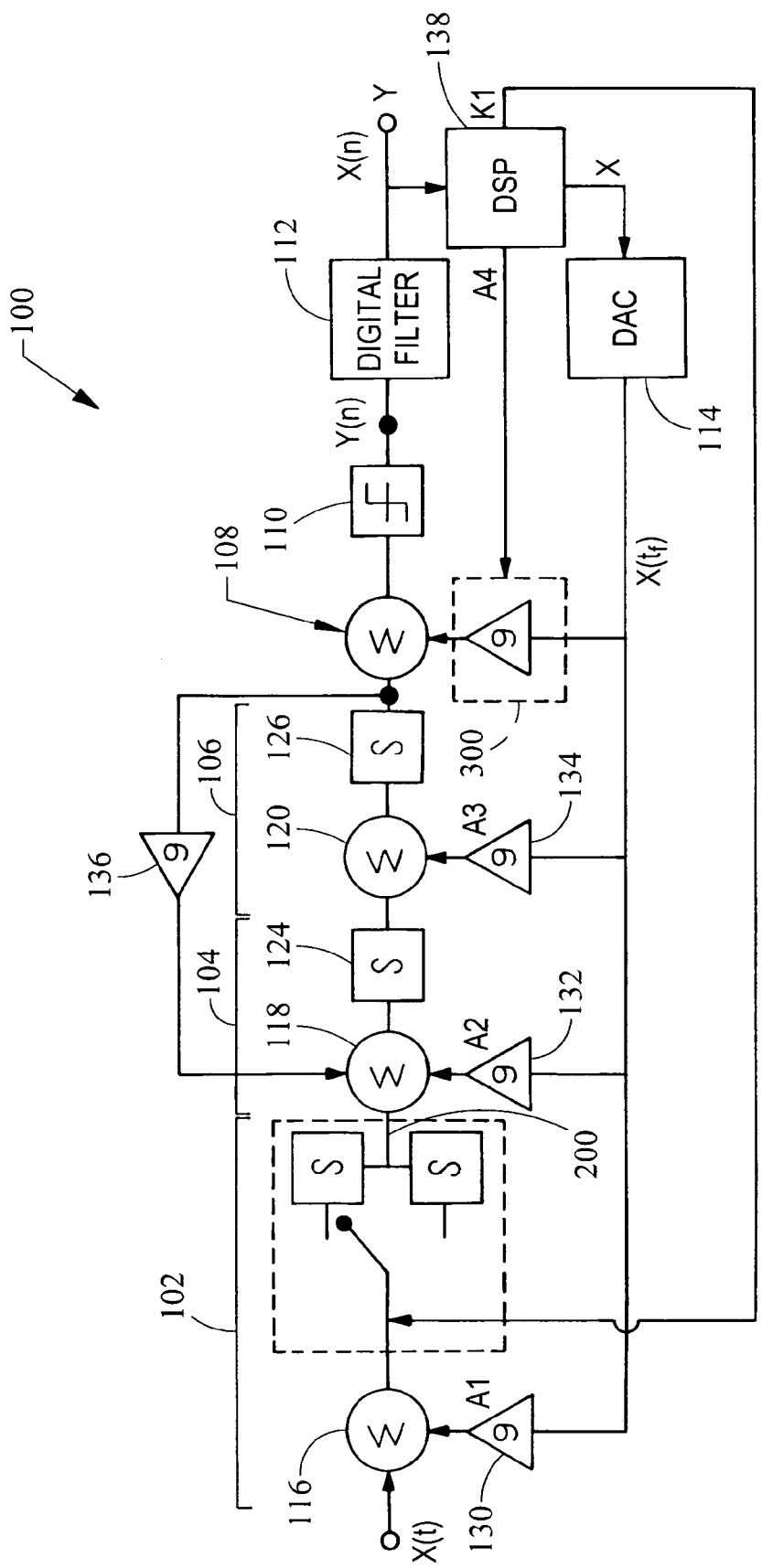
FIG. 2 is a schematic of a third order $\Sigma\Delta$ A/D converter having an enhanced integrator and a loop-delay compensator.

Referring now to the drawings, wherein like reference numerals designate identical corresponding parts throughout the several views, and more particularly to FIG. 2, a third order ΣΔ A/D converter 100 is shown having an enhanced integrator 200 and a loop-delay compensator 300.

The third order ΣΔ A/D converter 100 comprises three integration stages 102, 104, and 106 followed by a compensation node 108, a quantizer 110, and a digital filter 112. A digital-to-analog (D/A) converter 114 provides each integration stage with an analog representation of the instantaneous digital output x(n). The integration stages 102, 104, and 106 each have an adder 116, 118, and 120, and an integrator 200 (enhanced), 124, and 126, as shown. Multipliers 130, 132, and 134 multiply the feedback signal $X(t_f)$ by weight factors A1, A2, and A3, respectively. Other feedback or feed-forward paths may be added (such as, for example, through one or more additional multipliers 136) to communicate the output waveform from an Nth stage integrator to the adder/input of at least one other integrator.

In operation, an analog input signal x(t) received at the circuit input is processed into a high-speed stream of one-bit samples y(n), and digitally filtered to a slower stream of multi-bit samples x(n) at the output. The enhanced integrator 200 and the loop-delay compensator 300 receive coefficient signals K1 and A4, respectively, from a processor (preferably a digital signal processor (DSP) 138). The coefficient signals are generated in response to at least one signal (which may include x(n)) from the ΣΔ A/D converter.

The DSP 138, although presently preferred, is within one of several categories of processors that may be implemented for receiving signals from the ΣΔ A/D converter and outputting selectable coefficient signals, such as K1 and/or A4. Such categories of processors include hardwired processors and software processors, DSPs, programmable gate arrays, microprocessors, dedicated processors, or other signal processors. It is further understood that a single processor may be implemented with both the enhanced integrator and the loop-delay compensator circuits. Alternatively, the enhanced integrator and the loop delay compensator circuit may implement separate processors.

Enhanced Integrator

Figure 3:
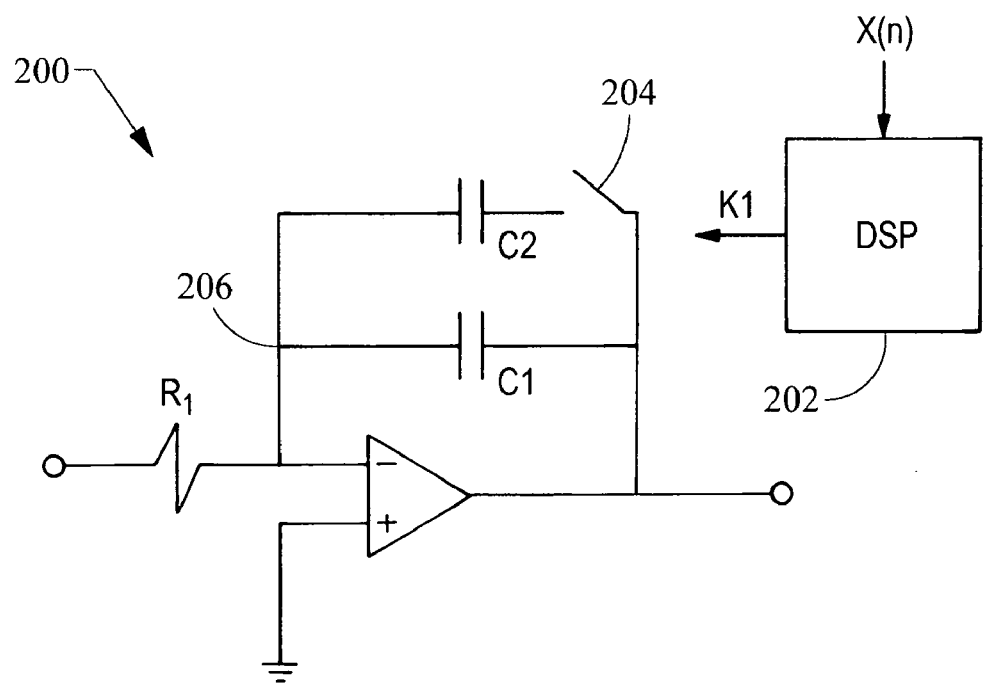
FIG. 3 is a schematic of an enhanced integrator having a changeable coefficient and in communication with a processor for receiving a selectable signal from the processor.

An enhanced integrator 200 incorporating an inverting integrator 206, is shown in FIG. 3. The enhanced integrator 200 receives a coefficient signal K1 from a processor 202 for controlling the status of a switch 204. The status of the switch 204 sets the coefficient of integration K.

In operation, the processor 202 receives a signal indicative of the performance of the ΣΔ A/D converter, such as the output signal x(n), and responsively generates a selectable coefficient signal K1. For example, if the magnitude of the output signal x(n) is within the bound output value (e.g., 0x7FFF (positive) or 0x8000 (negative)) the processor may (based upon a hardwire configuration or executable code) continuously generate a binary "0" so the switch 204 remains open and the coefficient of integration K does not change. If, however, the magnitude of the output signal x(n) exceeds the bound output value, the processor 202 may generate a "1", causing the switch 204 to close, thereby lowering the coefficient of integration, as discussed below.

The inverting integrator 206 has a transfer function defined by $R_1$, $C_1$, and $C_2$. If the switch 204 is open, the coefficient of integration is $$K = T_S/(R_1 \cdot C_1) \quad (1)$$

Where $T_S$ is the sampling period. If the switch 204 is closed, the coefficient of integration is:

$$K = T_S/(R_1(C_1+C_2)) \quad (2)$$

In one embodiment, the capacitive network is designed so that $$C_2/C_1 = 0.25 \quad (3)$$

And $$K = 0.1 \quad (4)$$

when the switch 204 is open.

Therefore, when the switch 204 closes, $$K = 0.08 \quad (5)$$

In an alternate embodiment, the capacitive network is configured such that the coefficient of integration is dependent upon two or more signals from the processor 202. In one example, the capacitive network has a third capacitor (not shown) in parallel with $C_1$ and $C_2$, and a second switch for connecting and disconnecting the third capacitor to the capacitive network. The processor 202 may be responsive to the output signal x(n) by generating a two bit binary signal (either 00, 01, 10, or 11, depending upon characteristics of the output signal x(n)) for controlling the first and second switches. Alternatively, the coefficient of integration may be modifiable by way of a changeable resistor, resistive network, or capacitive-resistive network.

Loop-Delay Compensator

Figure 4:
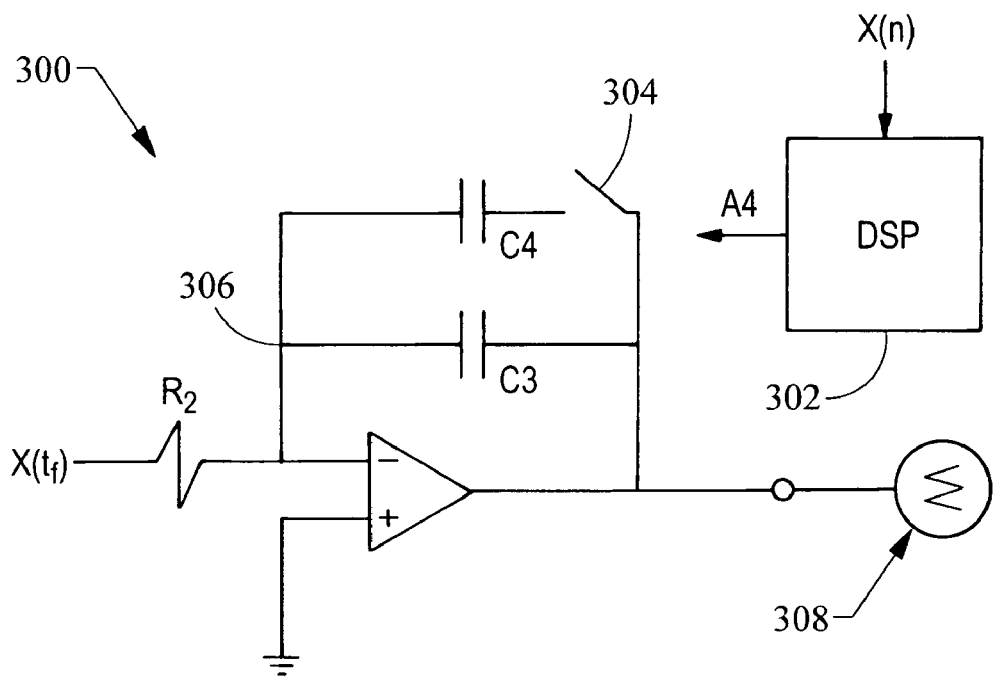
FIG. 4 is a schematic of a loop-delay compensator having a changeable coefficient and in communication with a processor for receiving a selectable signal from the processor.

A loop-delay compensator 300 embodying a multiplier 306 and an adder 308 (corresponding to adder 108 in FIG. 2) is shown in FIG. 4. The loop-delay compensator 300 receives a selectable coefficient signal A4 from a processor 302 for controlling the status of a switch 304. The status of the switch 304 sets a multiplication factor "g" for modifying the magnitude of a feedback signal $X(t_f)$.

In a first embodiment, the processor 302 is configurable to provide at least two ΣΔ loop-delay compensator coefficient values. The processor 302 outputs to the loop-delay compensator 300 a first signal $A4_1$ corresponding to a first ΣΔ loop-delay compensator multiplication factor $g_1$. The ΣΔ A/D converter 100 digitizes an input signal x(t) and the processor 302 determines the SNDR1 of the loop X→Y. The SNDR1 may be determined by a DSP 138 having a digital spectrum analyzer.

The processor 302 outputs to the loop-delay compensator 300 a second signal $A4_2$ corresponding to a second ΣΔ loop-delay compensator multiplication factor $g_2$. The ΣΔ A/D converter 100 digitizes an input signal x(t) and determines the $SNDR_2$ of the loop X→Y.

The processor is configurable to output $A4_1$ to the loop-delay compensator 300 if $SNDR_1$ is greater than $SNDR_2$, or $A4_2$ if $SNDR_2$ is greater than $SNDR_1$, thereby setting the switch 304 and fixing the multiplication factor of the loop-delay compensator 300 so that the ΣΔ A/D converter 100 performs with a high SNDR.

In a second embodiment, the processor 302 is configurable to determine the excess loop-delay of the ΣΔ A/D converter 100 and responsively provide a selectable coefficient signal A4 to set a loop-delay compensator multiplication factor "g". The multiplication factor "g" may be selectable from a group of two or more multiplication factors. In the present embodiment, the group of multiplication factors includes four values. Each value corresponds to an excess loop-delay period Δt:

TABLE 1

Excess loop-delay intervals and exemplary multiplication factors.
$T_S$ is the sample period.

| Δt | multiplication factor (g) | A4 |
|---|---|---|
| 0 to ¼ $T_S$ | 0.0 | 00 |
| ¼ $T_S$ to ½ $T_S$ | −0.4 | 01 |
| ½ $T_S$ to ¾ $T_S$ | −0.19 | 10 |
| ¾ $T_S$ to $T_S$ | −0.2 | 11 |

The excess loop-delay periods Δt, multiplication factors, and selectable output signals A4 are pre-programmed in a memory medium that is accessible by the processor. Examples of memory include ROM, RAM. The processor 302 is programmed to initially set the multiplication factor of the loop-delay compensator 300 to zero, creating an open circuit between the DAC 114 output and the compensation node 108. The processor 302 is programmed to apply a step-voltage to the input of the DAC 114, and determine the step-response of the sigma-delta A/D converter 100 by monitoring the output x(n) of the digital filter 112. In most applications, the excess loop-delay will not exceed one sample period (Ts). That is, Δt is typically within the range of 0 to Ts. The processor 138 correlates the determined excess loop-delay to an excess loop-delay interval, and outputs a signal A4 to the loop-delay compensator circuit 300 for setting the switch 304 and, hence, the multiplication factor. It is noted that the multiplication factor of the loop-delay compensator 300 is independent of the multiplication factors of the feedback multipliers 130, 132, 134, and 136, which are independent of one another.

The ΣΔ A/D converter 100 shown in FIG. 2 has both an enhanced integrator 200 and a loop-delay compensator 300. However, it is to be understood by those skilled in the art that a ΣΔ A/D converter 100 may incorporate an enhanced integrator 200 of the present invention without the loop-delay compensator 300; and may incorporate a loop-delay compensator 300 of the present invention without an enhanced integrator 200.

Method for Improving the Performance of a ΣΔ A/D Converter

It is contemplated that the enhanced integration and loop-delay compensation disclosed herein are not limited to the physical implementations shown in FIGS. 2-4. Also, the enhanced integration and loop-delay compensation discussed herein may be implemented in other ΣΔ A/D converter systems, including first and higher order, feed-forward, and feedback designs. ΣΔ A/D converter systems may implement one or more versions of a method of enhanced integration and loop-delay compensation according to aspects of the present invention for improving the performance of a ΣΔ A/D converter.

Figure 5:
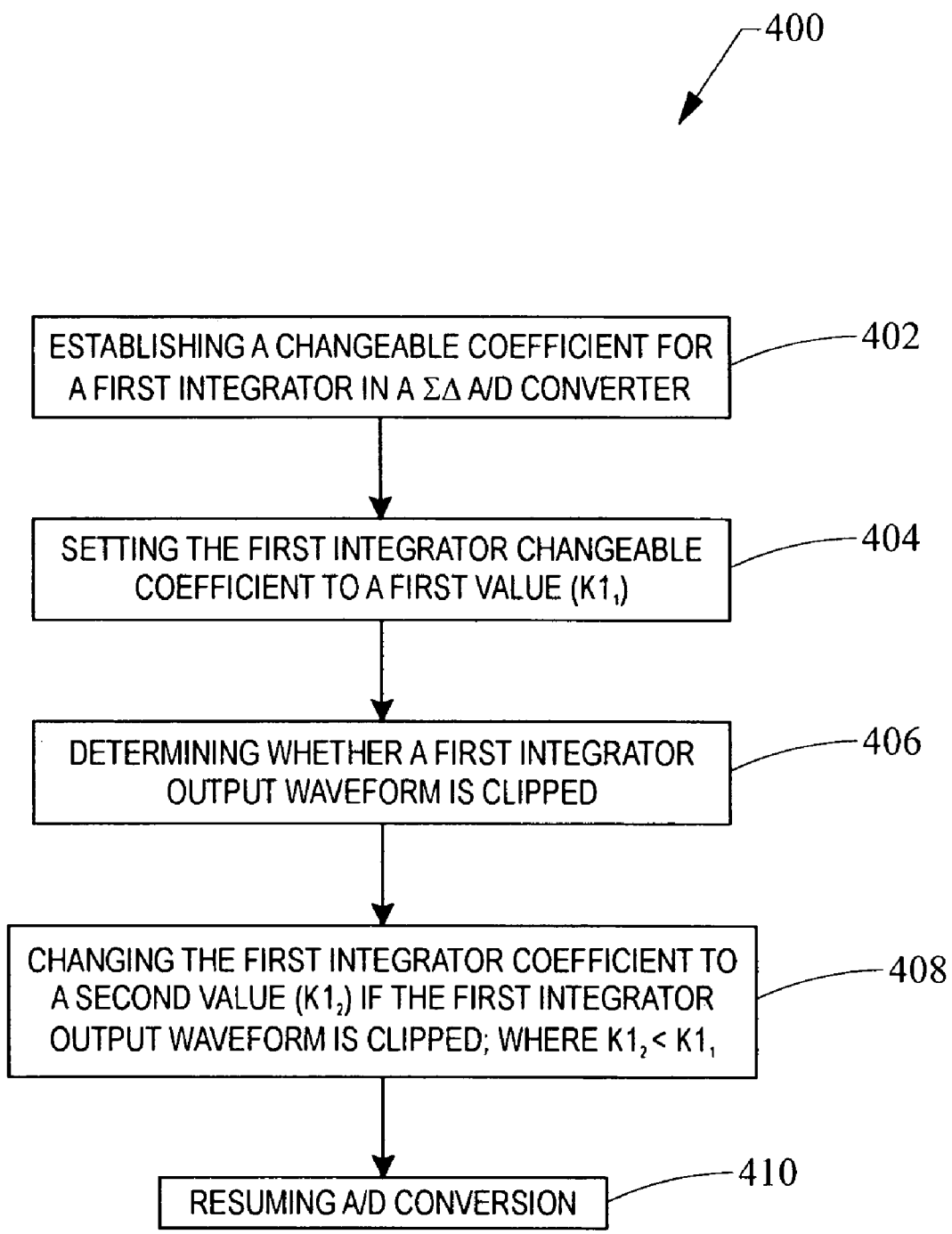
FIG. 5 is a flowchart for setting an enhanced integrator coefficient.

FIG. 5 shows steps 400 for improving the performance of a ΣΔ A/D converter by compensating for input signal noise and peaking. At 402, the method is initiated by establishing a changeable coefficient for a first integrator. At 404, the first integrator coefficient is set to a first value. At 406, it is determined whether the first integrator output waveform is clipped. This step may include monitoring the output waveform x(n) at the bound values, or monitoring the first integrator output waveform and comparing the waveform amplitude to one or more predetermined value(s). If the waveform is clipped, the first integrator coefficient is set to a second value at 408, where the second value is less than the first value. The first integrator coefficient may be set by receiving a selectable signal that corresponds to a first or second coefficient value.

Figure 6:
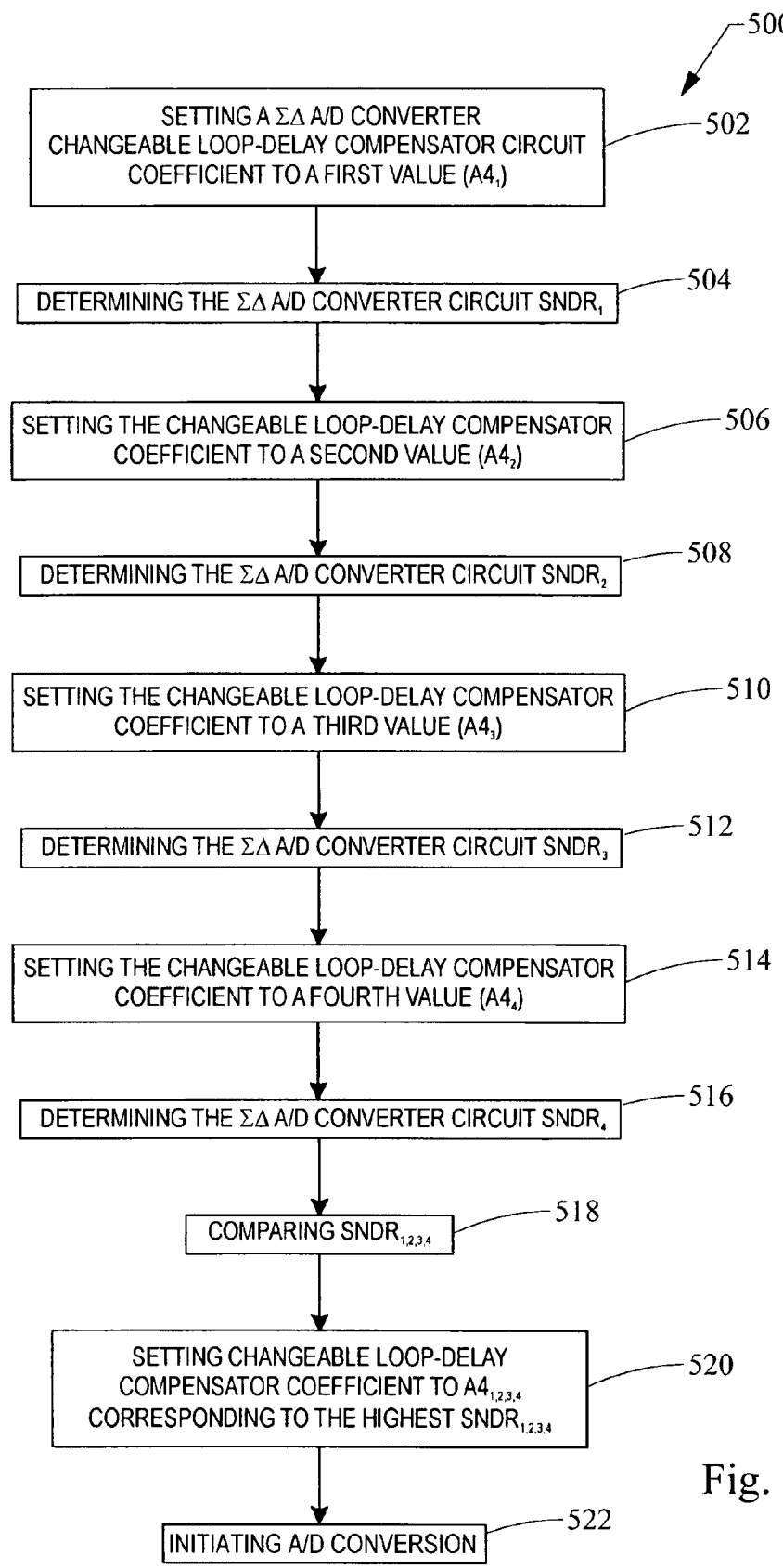
FIG. 6 is a flowchart for setting a loop delay compensator coefficient for a $\Sigma\Delta$ A/D converter based upon at least two SNDR measurements.

FIG. 6 shows steps 500 for improving the performance of a ΣΔ A/D converter by compensating for excess loop-delay according to a first embodiment. The method includes the steps of setting a changeable loop-delay compensator circuit coefficient to first, second, third, and fourth values, and determining, in turn, each SNDR for the ΣΔ A/D converter loop. As shown, at 502 and 504 the coefficient is set to a first value and the $SNDR_1$ of the circuit is determined. At 506 and 508 the coefficient is set to a second value and the $SNDR_2$ of the circuit is determined. At 510 and 512 the coefficient is set to a third value and the $SNDR_3$ of the circuit is determined. At 514 and 516 the coefficient is set to a fourth value and the $SNDR_4$ of the circuit is determined. At 518 and 520 the coefficient is set to the value (first, second, third, or fourth) that corresponds to the highest $SNDR_{1,2,3,4}$.

Figure 7:
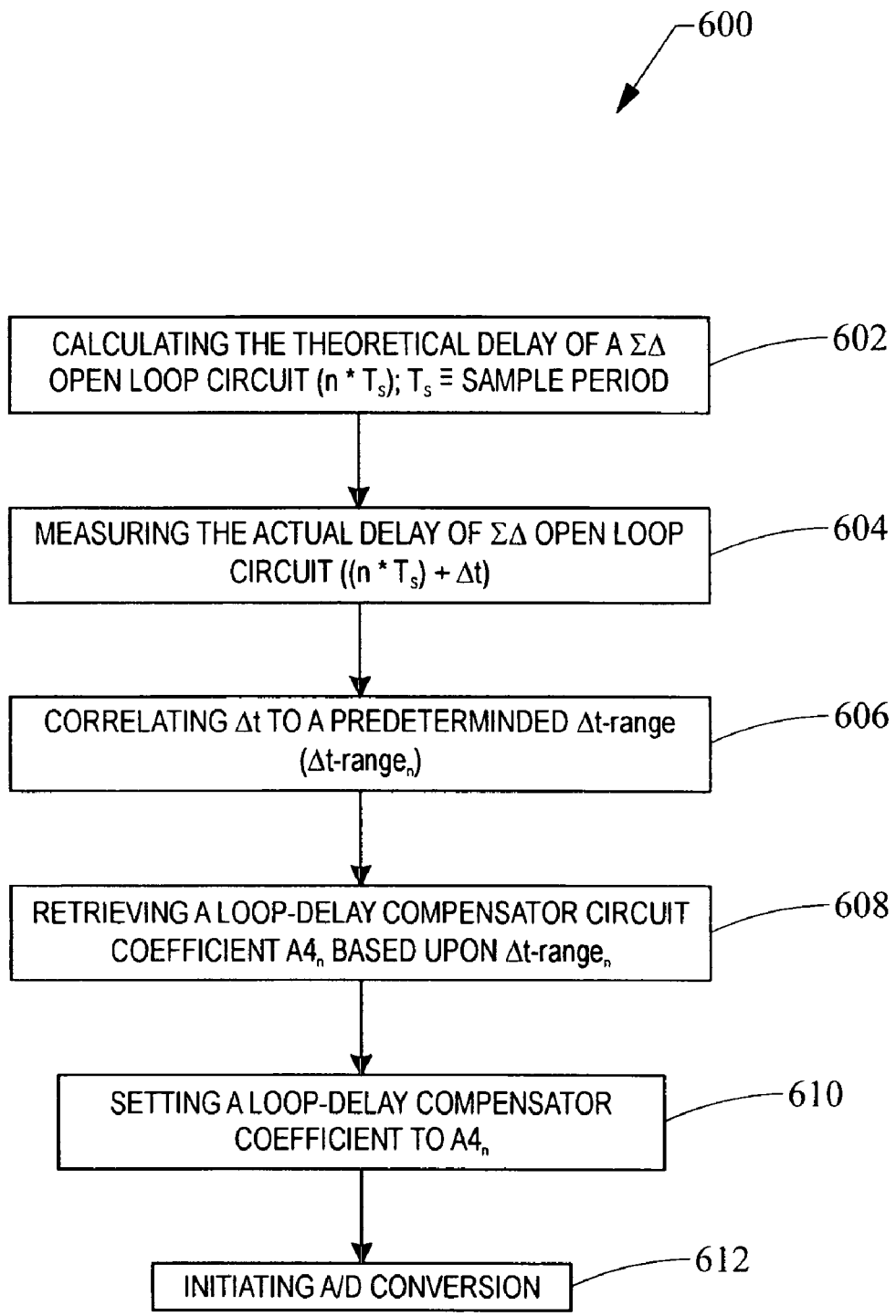
FIG. 7 is a flowchart for setting a loop delay compensator coefficient for a $\Sigma\Delta$ A/D converter based upon an excess loop-delay determination.

FIG. 7 shows steps 600 for improving the performance of a ΣΔ A/D converter by compensating for loop-delay according to a second embodiment. At 602 the theoretical loop-delay of the ΣΔ A/D converter loop is determined. The theoretical loop-delay may be determined, for example, by referencing a component database, or may be received through a user interface. At 604 the actual loop-delay of the ΣΔ A/D converter loop circuit is determined. The actual loop-delay may be determined by measuring the step-response of the loop and may be broken down into theoretical delay-plus-excess delay.

In one embodiment, excess loop-delay is categorized by predetermined periods of time and one coefficient value is correlated to each of the predetermined periods of excess loop-delay. The beginning and end of each period is defined as a fraction of the sample period, such as a period$_n$ from ¼ $T_S$ to ½ $T_S$; and a period$_{n+1}$ from ½ $T_S$ to ¾ $T_S$. At 608 and 610 the loop-delay compensator coefficient is set to the value that correlates to the actual loop-delay. The coefficient may be set by receiving a selectable signal corresponding to one of two or more changeable coefficient values.

Figure 8:
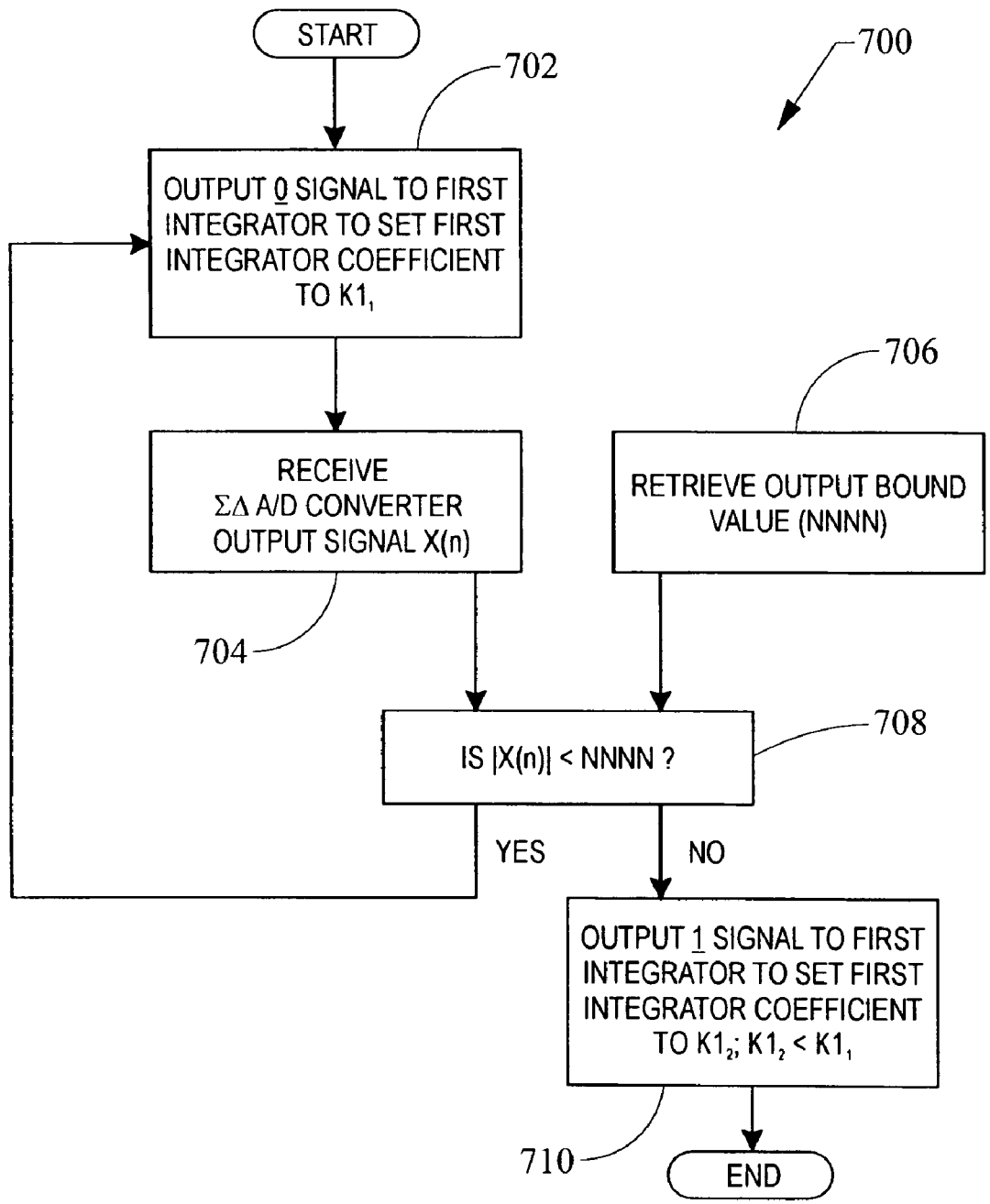
FIG. 8 is a flowchart of a program for a processor to output a selectable signal to set a first integrator coefficient for a $\Sigma\Delta$ A/D converter.

FIGS. 8-11 illustrate various methods that may be stored as instructions in a memory and executed by a processor such as disclosed above. FIG. 8 shows an example of the steps executable by a processor for carrying out a program 700 to determine the first integrator coefficient for a ΣΔ A/D converter. At 702 the program causes the processor to send a binary "zero" signal to the first integrator to thereby set the first integrator coefficient to a first value $K1_1$. At 704 the processor receives the output of the ΣΔ A/D converter x(n). At 706 the program retrieves (or alternatively recalls) the output bound value (minimum/maximum representative signal) of the converter, and compares it to the output signal x(n) at 708. If the output signal x(n) is less than the bound value, the program causes the processor to sustain a binary "zero" signal to the first integrator. If the output signal x(n) is not less than the bound value, then at 710 the processor sends a binary "one" signal to the first integrator to set the first integrator coefficient to a second value $K1_2$, which is less than $K1_1$ so that signal distortion is decreased.

Figure 9:
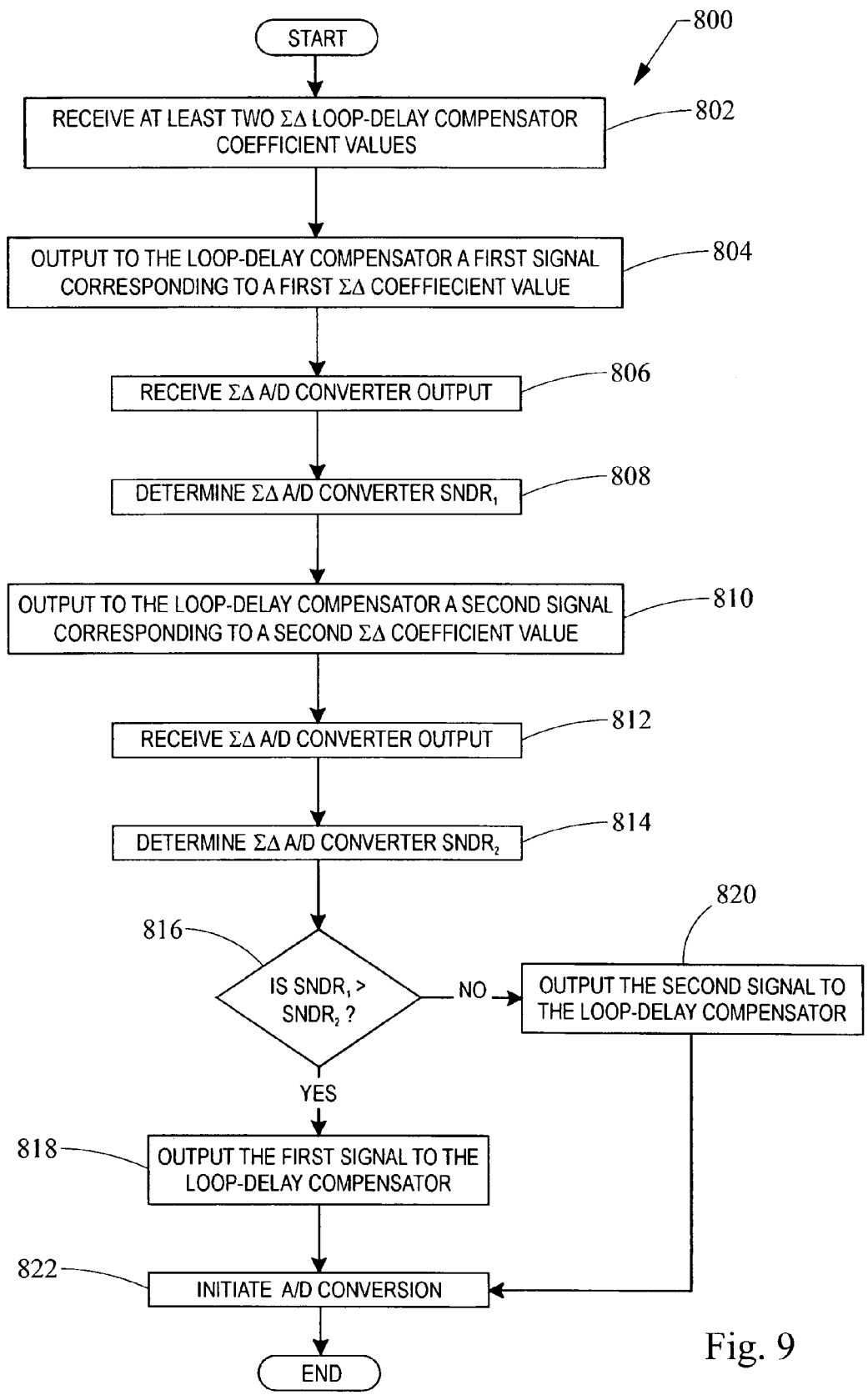
FIG. 9 is a flowchart of a first program for a processor to output a selectable signal to set an A/D $\Sigma\Delta$ loop-delay compensator coefficient value to obtain the highest SNDR for the circuit.

FIG. 9 shows an example of the steps executable by a processor for carrying out a program 800 to determine the coefficient for a loop-delay compensator for a ΣΔ A/D converter. At 802 the program causes the processor to obtain at least two ΣΔ loop-delay compensator coefficient values. At 804 the processor outputs to the loop-delay compensator a first signal corresponding to the first ΣΔ loop-delay compensator coefficient value. At 806, the processor receives the ΣΔ A/D converter output signal. Based on the output signal, the program at 808 determines the $SNDR_1$ of the loop.

At 810, the processor outputs to the loop-delay compensator a second signal corresponding to a second ΣΔ loop-delay compensator coefficient value. At 812 the processor receives a second ΣΔ A/D converter output signal. Based on the output signal, the program at 814 determines the $SNDR_2$ of the loop.

At 816 the program determines if $SNDR_1$ is greater than $SNDR_2$. At 818 and 820 the processor outputs the signal that corresponds to the greater $SNDR_{1,2}$. At 822, the processor initiates A/D conversion.

In an alternative program, it is not necessary that the processor receive the actual ΣΔ loop-delay compensator coefficient values, i.e., step 802 may be omitted. Note that it is only necessary that the program provide first and second signals corresponding to first and second ΣΔ loop-delay compensator coefficient values, as shown at 804 and 810. The coefficients are inherently set by the preconfigured hardware that receives the first and second signals.

Figure 10:
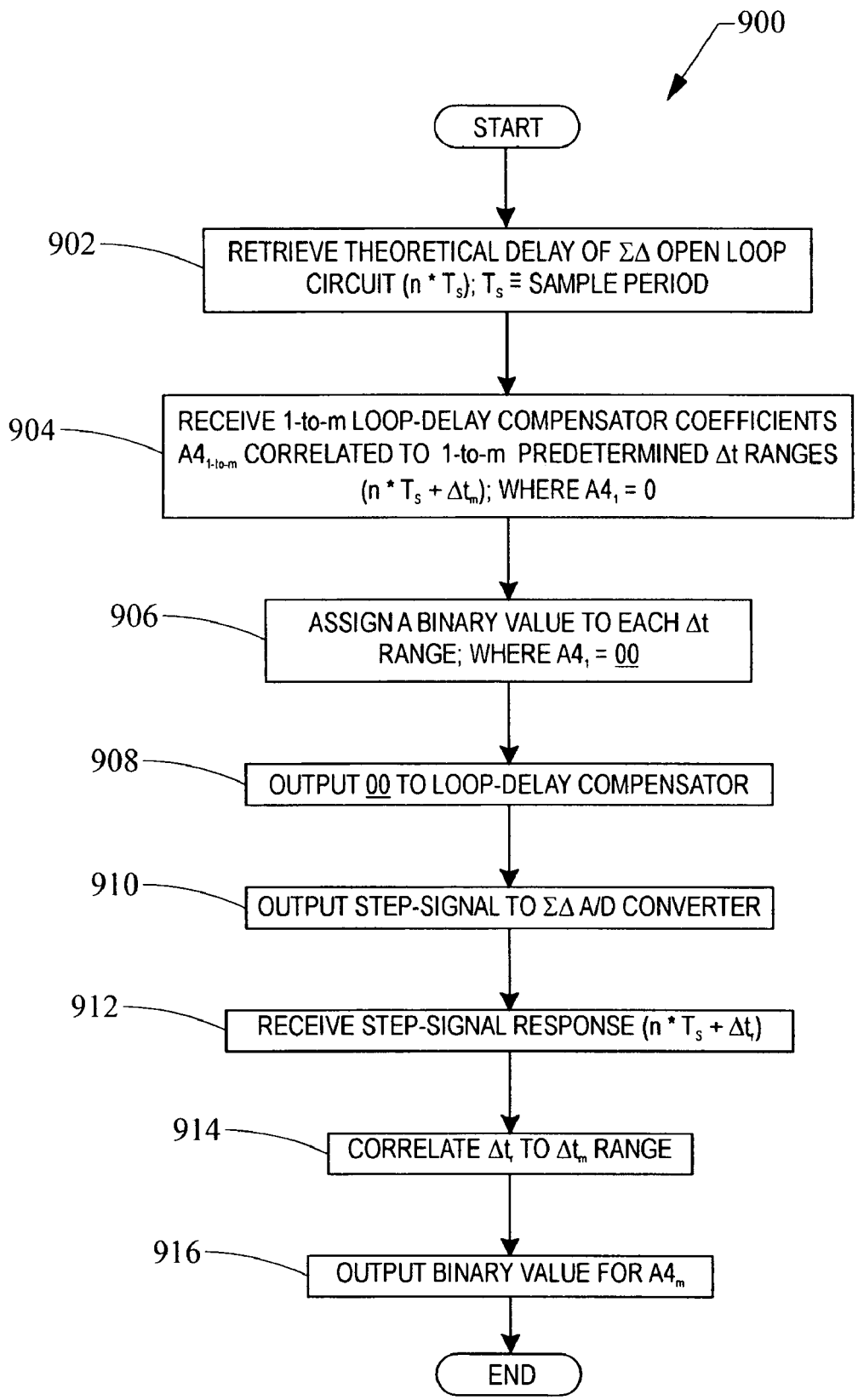
FIG. 10 is a flowchart of a second program for a processor to output a selectable signal to set an $\Sigma\Delta$ loop-delay compensator coefficient value based upon the excess delay of the circuit.

FIG. 10 shows an example of the steps executable by a processor for carrying out a program 900 to determine the coefficient for a ΣΔ A/D converter loop-delay compensator. The program 900 selects a loop-delay compensator coefficient based upon the excess loop-delay of the ΣΔ A/D converter. The excess loop-delay is correlated to one of at least two loop-delay ranges, wherein each range has an associated loop-delay compensator coefficient.

At 902 the program causes the processor to obtain the theoretical loop-delay of the ΣΔ A/D converter. Although the theoretical loop-delay may be expressed in various forms, the theoretical loop-delay in the present example is expressed as a multiple of the sample rate, such as a theoretical loop-delay of ten samples ($n \cdot T_S$; n=10). At 904, the processor obtains at least two (preferably four) definite excess loop-delay ranges. In this example, each excess loop-delay range is expressed in terms of fractions of one additional sample period, such as an excess loop-delay range of ($\frac{1}{2} \cdot T_S$) to ($\frac{3}{4} \cdot T_S$)≡$\Delta t_m$. The processor also obtains, for each excess loop-delay range, one loop-delay compensator coefficient, which may be a rational number. At 906 the program assigns a unique signal to each excess loop-delay range $\Delta t_m$.

At 908, the processor outputs a signal corresponding to a loop-delay compensator coefficient of zero. Consequently, the loop-delay compensator is virtually removed (open circuited) from the ΣΔ A/D converter. At 910, the processor provides a step-signal to the ΣΔ A/D converter. At 912, the processor receives the step-signal response, including a theoretical loop-delay component and an excess loop-delay component $\Delta t_r$. At 914, the program allots $\Delta t_r$ to the appropriate $\Delta t_m$ range. At 916, the processor outputs to the loop-delay compensator the signal corresponding to the loop-delay compensator coefficient assigned to $\Delta t_m$.

Figure 11:
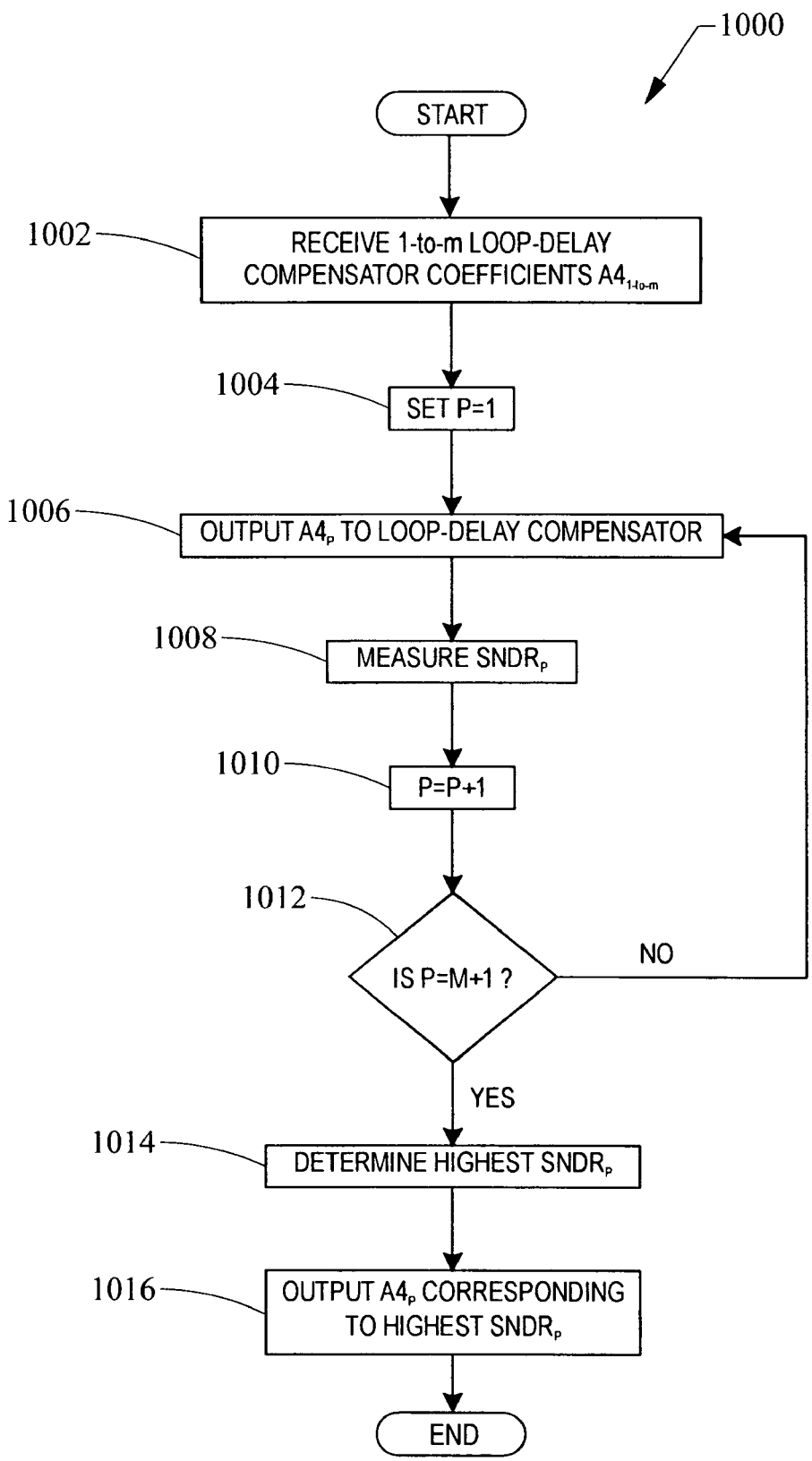
FIG. 11 is a flowchart of a third program for a processor to output a selectable signal to set an A/D $\Sigma\Delta$ loop-delay compensator coefficient value to obtain the highest SNDR for the circuit.

FIG. 11 shows an example of the steps executable by a processor for carrying out a program 1000 to determine the coefficient for a ΣΔ A/D converter loop-delay compensator. The program 1000 sets the loop-delay compensator coefficient to a first value, causes the processor to receive the output signal x(n), determines the $SNDR_P$, then sets the loop-delay compensator coefficient to a second value, and determines the $SNDR_{P+1}$. The processor tests M number of loop-delay compensator coefficients. The program continues to set the loop-delay compensator coefficient to the next values until $SNDR_M$ is determined. The processor selects the coefficient associated with the highest SNDR.

Referring to the steps in FIG. 11, the program causes the processor to obtain at least two (M≧2) loop-delay compensator coefficients. At 1004 to 1012, the program causes the processor to set each loop-delay compensator coefficient and measure the SNDR. At 1014 the program determines the highest SNDR. At 1016 the processor outputs the signal that corresponds to the loop-delay compensator coefficient that provided the highest SNDR.

Figure 12A:
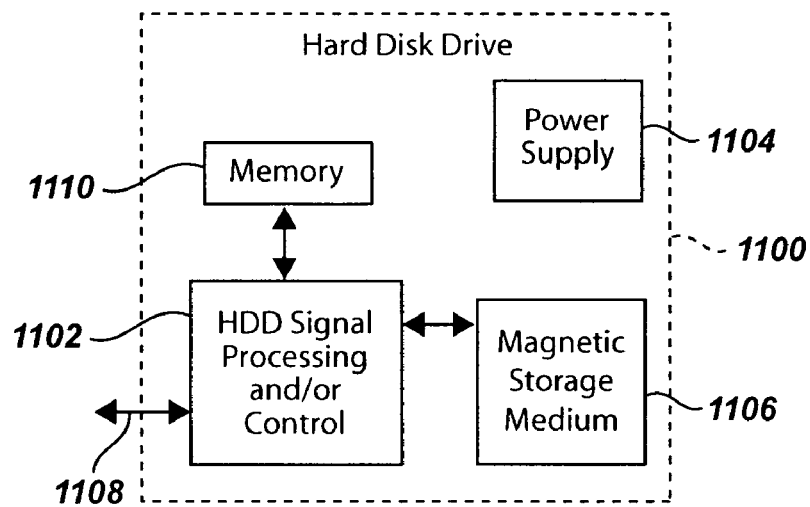
FIG. 12A is a functional block diagram of a hard disk drive.

Referring now to FIGS. 12A-12G, various exemplary implementations of the present invention are shown. Referring now to FIG. 12A, the disclosed ΣΔ A/D converter 100 may be implemented in a hard disk drive 1100 in either or both signal processing and/or control circuits 1102. In some implementations, the signal processing and/or control circuit 1108 and/or other circuits (not shown) in the HDD 1100 may process data, perform coding and/or encryption, perform calculations, and/or format data that is output to and/or received from a magnetic storage medium 1106.

The HDD 1100 may communicate with a host device (not shown) such as a computer, mobile computing devices such as personal digital assistants, cellular phones, media or MP3 players and the like, and/or other devices via one or more wired or wireless communication links 1108. The HDD 1100 may be connected to memory 1110 such as random access memory (RAM), low latency nonvolatile memory such as flash memory, read only memory (ROM) and/or other suitable electronic data storage.

Figure 12B:
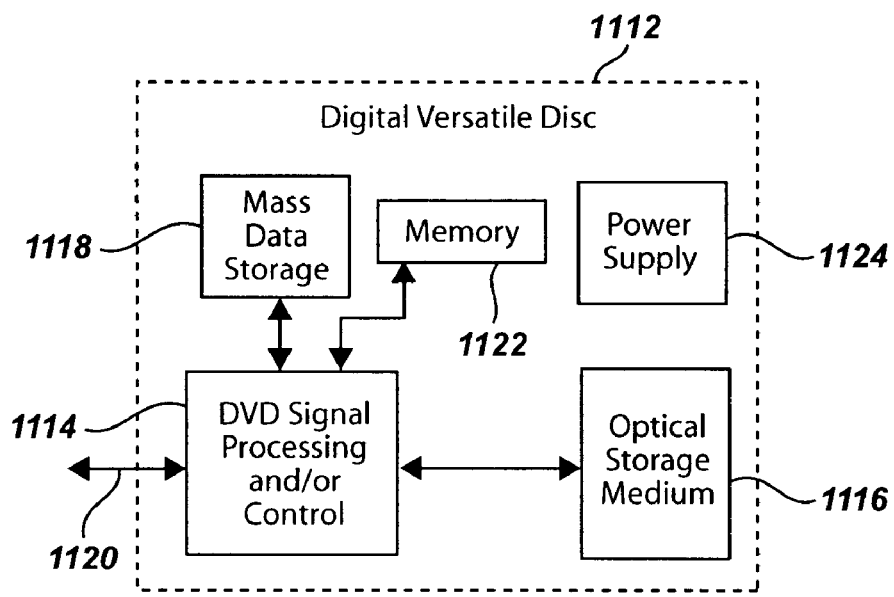
FIG. 12B is a functional block diagram of a digital versatile disk (DVD)

Referring now to FIG. 12B, the ΣΔ A/D converter 100 can be implemented in a digital versatile disc (DVD) drive 410. The present invention may implement and/or be implemented in either or both signal processing and/or control circuits, which are generally identified in FIG. 12B at 1114. The signal processing and/or control circuit 1114 and/or other circuits (not shown) in the DVD 1112 may process data, perform coding and/or encryption, or perform calculations. In some implementations, the signal processing and/or control circuit 1114 and/or other circuits (not shown) in the DVD 1112 can also perform other functions such as encoding and/or decoding and/or any other A/D signal processing functions associated with a DVD drive.

The DVD drive 1112 may communicate with an output device (not shown) such as a computer, television or other device via one or more wired or wireless communication links 1120. The communication link may require an A/D conversion implementing the circuitry and techniques described above. The DVD 1112 may communicate with mass data storage 1118 that stores data in a nonvolatile manner. The mass data storage 1118 may include a hard disk drive (HDD). The HDD may have the configuration shown in FIG. 12A. The HDD may be a mini HDD that includes one or more platters having a diameter that is smaller than approximately 1.8". The DVD 1112 may be connected to memory 1122 such as RAM, ROM, low latency nonvolatile memory such as flash memory and/or other suitable electronic data storage.

Figure 12C:
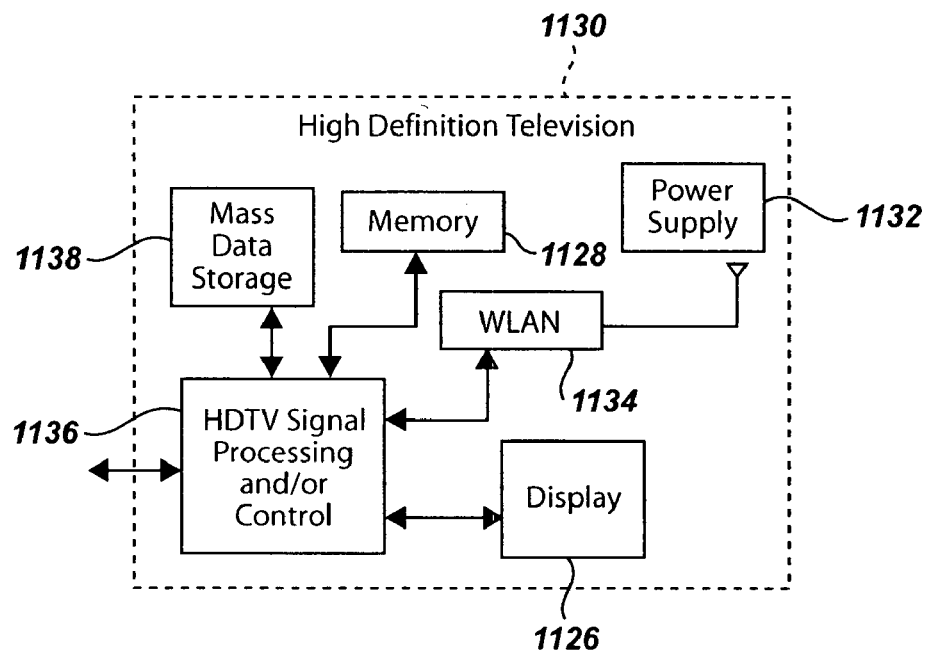
FIG. 12C is a functional block diagram of a high definition television.

Referring now to FIG. 12C, the present invention can be implemented in a high definition television (HDTV) 1130. The present invention may be implemented in either or both signal processing and/or control circuits, which are generally identified in FIG. 12C at 1136. The HDTV 1130 receives HDTV input signals in either a wired or wireless format and generates HDTV output signals for a display 1126. In some implementations, signal processing circuit and/or control circuit 1136 and/or other circuits (not shown) of the HDTV 1130 may process data, perform coding and/or encryption, perform calculations, format data and/or perform any other type of HDTV processing that may be required.

The HDTV 1130 may communicate with mass data storage 1138 that stores data in a nonvolatile manner such as optical and/or magnetic storage devices. At least one HDD may have the configuration shown in FIG. 12A and/or at least one DVD may have the configuration shown in FIG. 12B. The HDD may be a mini HDD that includes one or more platters having a diameter that is smaller than approximately 1.8". The HDTV 1130 may be connected to memory 1128 such as RAM, ROM, low latency nonvolatile memory such as flash memory and/or other suitable electronic data storage. The HDTV 1130 also may support connections with a WLAN via a WLAN network interface 1134.

Figure 12D:
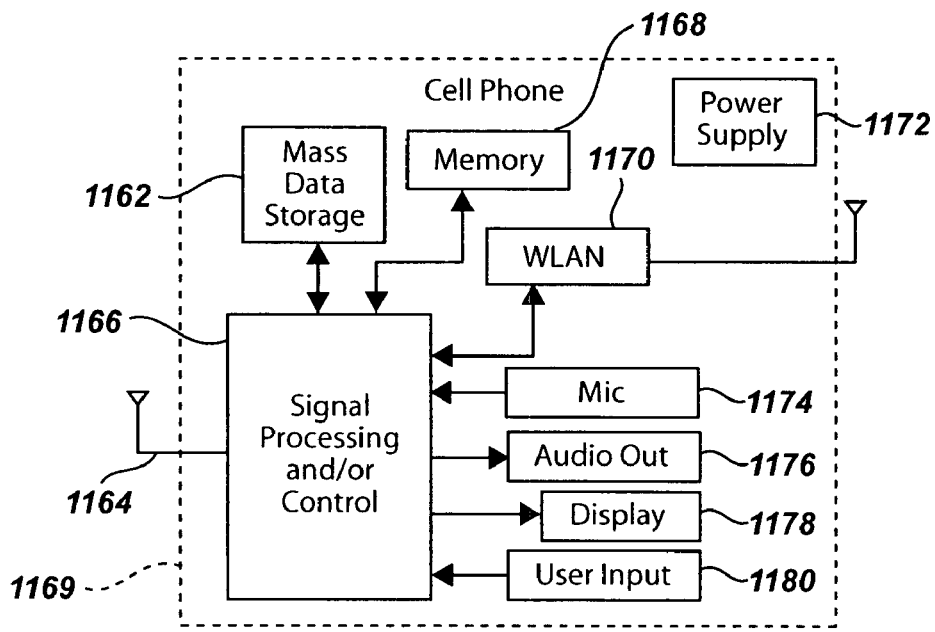
FIG. 12D is a functional block diagram of a cellular phone.

Referring now to FIG. 12D, the present invention can be implemented in a cellular phone 1169 that may include a cellular antenna 1164. The present invention may be implemented in either or both signal processing and/or control circuits, which are generally identified in FIG. 12D at 1166, or a WLAN interface. In some implementations, the cellular phone 1169 includes a microphone 1174, an audio output 1176 such as a speaker and/or audio output jack, a display 1178 and/or an input device 1180 such as a keypad, pointing device, voice actuation and/or other input device. The signal processing and/or control circuits 1166 and/or other circuits (not shown) in the cellular phone 1169 may process data, perform coding and/or encryption, perform calculations, format data and/or perform other cellular phone functions.

The cellular phone 1169 may communicate with mass data storage 1162 that stores data in a nonvolatile manner such as optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The cellular phone 1169 may be connected to memory 1168 such as RAM, ROM, low latency nonvolatile memory such as flash memory and/or other suitable electronic data storage. The cellular phone 1169 also may support connections with a WLAN via a WLAN network interface 1170.

Figure 12E:
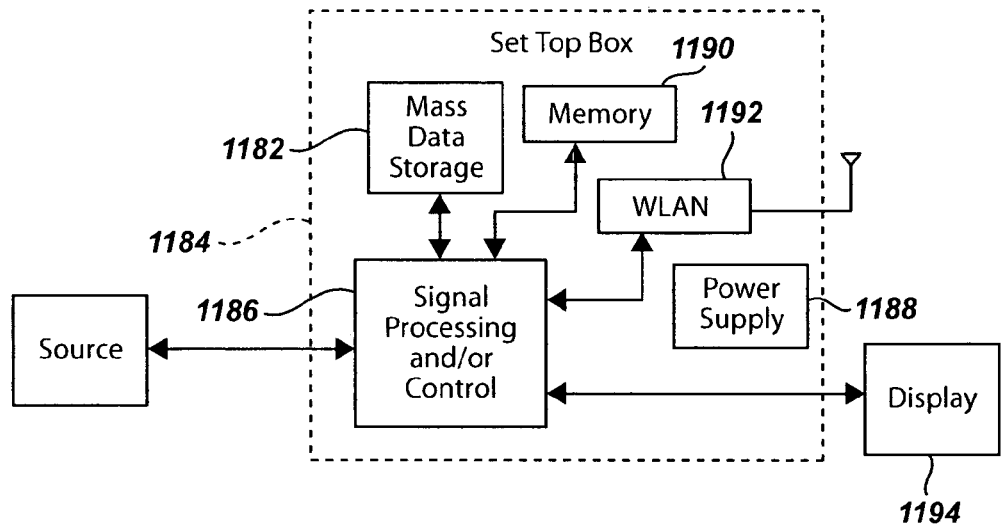
FIG. 12E is a functional block diagram of a set top box.

Referring now to FIG. 12E, the present invention can be implemented in a set top box 1184. The present invention may be implemented in either or both signal processing and/or control circuits, which are generally identified in FIG. 12F at 1186, a WLAN interface, or a mass data storage of the set top box 1184. The set top box 1184 receives signals from a source such as a broadband source and outputs standard and/or high definition audio/video signals suitable for a display 1194 such as a television and/or monitor and/or other video and/or audio output devices. The signal processing and/or control circuits 1186 and/or other circuits (not shown) of the set top box 1184 may process data, perform coding and/or encryption, perform calculations, format data and/or perform any other set top box function.

The set top box 1184 may communicate with mass data storage 1182 that stores data in a nonvolatile manner. The mass data storage 1182 may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The set top box 1184 may be connected to memory 1190 such as RAM, ROM, low latency nonvolatile memory such as flash memory and/or other suitable electronic data storage. The set top box 1184 also may support connections with a WLAN via a WLAN network interface 1192.

Figure 12F:
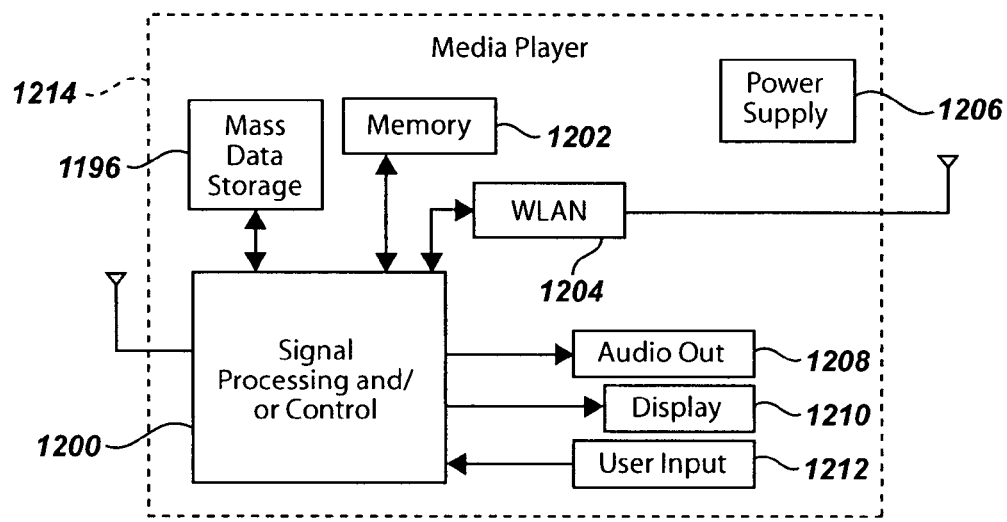
FIG. 12F is a functional block diagram of a media player.

Referring now to FIG. 12F, the present invention can be implemented in a media player 1214. The present invention may be implemented in either or both signal processing and/or control circuits, which are generally identified in FIG. 12F at 1200, or a WLAN interface. In some implementations, the media player 1214 includes a display 1210 and/or a user input 1212 such as a keypad, touchpad and the like. In some implementations, the media player 1214 may employ a graphical user interface (GUI) that typically employs menus, drop down menus, icons and/or a point-and-click interface via the display 1210 and/or user input 1212. The media player 1214 further includes an audio output 1208 such as a speaker and/or audio output jack. The signal processing and/or control circuits 1200 and/or other circuits (not shown) of the media player 1214 may process data, perform coding and/or encryption, perform calculations, format data and/or perform any other media player function.

The media player 1214 may communicate with mass data storage 1196 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". The media player 1214 may be connected to memory 1202 such as RAM, ROM, low latency nonvolatile memory such as flash memory and/or other suitable electronic data storage. The media player 1214 also may support connections with a WLAN via a WLAN network interface 1204. Still other implementations in addition to those described above are contemplated.

It is intended that the foregoing detailed description be understood as an illustration of selected forms that the invention can take and not as a definition of the invention. It is only the following claims, including all equivalents, that are intended to define the scope of this invention.

What is claimed is:

1. An analog-to-digital (A/D) converter, comprising:
    a processor; and
    a sigma-delta modulator in communication with the processor and having a plurality of changeable coefficients, wherein a first changeable coefficient is controlled by a first selectable coefficient signal generated by the processor in response to an output signal of the A/D converter exceeding a predetermined value, and
    wherein a second changeable coefficient is controlled by a second selectable coefficient signal determined by the processor, wherein the processor determines the second selectable coefficient signal by comparing a first signal-to-noise-plus-distortion ratio (SNDR) of the A/D converter when the second changeable coefficient is set to a first value, with a second (SNDR) of the A/D converter when the second changeable coefficient is set to a second value.

2. The analog-to digital converter of claim 1 wherein the sigma-delta modulator is a third-order sigma-delta modulator that includes a first integrator to receive the first selectable coefficient signal.

3. The analog-to-digital converter of claim 1 wherein the processor is a digital signal processor.

4. The analog-to-digital converter of claim 2 wherein the first integrator comprises an inverting integrator having a first input resistor and a first feedback capacitor in parallel with a second feedback capacitor to define a value of the first changeable coefficient.

5. The analog-to-digital converter of claim 4 wherein a ratio of the value of the second capacitor to the value of the first capacitor is approximately 0.25.

6. The analog-to-digital converter of claim 1 further comprising a switched capacitive network for receiving the selectable coefficient signal.

7. A method for automatically adjusting the performance of a sigma-delta modulated analog-to-digital (A/D) converter, comprising:
setting a first integrator coefficient of the A/D converter to a first integrator coefficient value;
providing a signal for automatically adjusting the first integrator coefficient to a second integrator coefficient value in response to a determination that a first integrator output waveform is clipped;
setting a compensator coefficient of a compensator circuit of the A/D converter to a first compensator value and determining a first signal-to-noise-plus-distortion (SNDR) value;
setting the compensator coefficient of the compensator circuit of the A/D converter to a second compensator value and determining a second SNDR value; and
comparing the first SNDR value to the second SNDR value and responsively setting the compensator coefficient to the compensator value that corresponds to the greater of the first and second SDNR values.

8. The method of claim 7 further comprising:
setting a switch in communication with a capacitive network to a first position to set the first integrator coefficient to the first integrator coefficient value; and
switching the switch to a second position to adjust the first integrator coefficient to the second integrator coefficient value.

9. The method of claim 8 further comprising:
receiving an output signal from the sigma-delta modulated (A/D) converter and determining, based upon a shape of the output signal, whether the first integrator output waveform is clipped.

10. An analog-to-digital converter, comprising:
a sigma-delta modulator;
a loop-delay compensator circuit in communication with the sigma-delta modulator and having a changeable coefficient, wherein the changeable coefficient is controlled by a selectable coefficient signal; and
a processor configured to measure a step response and determine a loop-delay period of the analog-to-digital converter and to generate the selectable coefficient signal based on the loop-delay period, the selectable coefficient signal corresponding to one of at least a first or a second selectable value.

11. The analog-to-digital converter of claim 10 wherein the processor is a digital signal processor.

12. The analog-to-digital converter of claim 11 wherein the digital signal processor includes a digital spectrum analyzer.

13. The analog-to-digital converter of claim 10 wherein the processor is selected from the group consisting of: a hardwired processor, a software processor, a programmable gate array, a microprocessor, and a dedicated processor.

14. The analog-to-digital converter of claim 10 wherein the sigma-delta modulator has three integration stages.

15. The analog-to-digital converter of claim 10 further comprising a digital filter in communication with the sigma-delta modulator.

16. The analog-to-digital converter of claim 10 wherein the selectable coefficient signal corresponds to one of four selectable values.

17. An analog-to-digital converter, comprising:
a sigma-delta modulator;
a loop-delay compensator circuit in communication with the sigma-delta modulator and having a changeable coefficient, wherein the changeable coefficient is controlled by a selectable coefficient signal; and
a processor configured to measure a step response of the analog-to-digital converter and generate the selectable coefficient signal, the selectable coefficient signal corresponding to one of at least a first or a second selectable value,
wherein the selectable coefficient signal corresponds to one of four selectable values, and
wherein the four selectable values include multiplication factors, each within a range of approximately 0.0 dBFS to −0.4 dBFS.

18. The analog-to-digital converter of claim 16 wherein the selectable coefficient signal is a two-bit binary signal.

19. The analog-to-digital converter of claim 18 wherein the selectable coefficient signal is pre-programmed in a memory medium.

20. The analog-to-digital converter of claim 10 further comprising an enhanced integrator in communication with the processor.

21. An analog-to-digital converter, comprising:
a sigma-delta modulator;
a loop-delay compensator circuit in communication with the sigma-delta modulator and having a changeable coefficient, wherein the changeable coefficient is controlled by a selectable coefficient signal;
a processor configured to measure a step response of the analog-to-digital converter and generate the selectable coefficient signal, the selectable coefficient signal corresponding to one of at least a first or a second selectable value; and
an enhanced integrator in communication with a second processor in communication with the sigma-delta modulator.

22. A method for automatically adjusting the performance of a sigma-delta modulated analog-to-digital (A/D) converter having a loop-delay compensation circuit, comprising:
measuring a loop-delay period of the analog-to-digital converter;
associating the measured loop-delay period with one of at least two predetermined and non-overlapping delay intervals; and
setting a loop-delay compensation circuit coefficient based upon the one associated delay interval.

23. The method of claim 22 further comprising open circuiting the sigma-delta modulated analog-to-digital converter prior to measuring the loop-delay period.

24. A method for selecting a loop-delay compensation circuit coefficient for a sigma-delta modulated analog-to-digital converter, comprising:
providing an output signal to open loop a sigma-delta modulated analog-to-digital converter circuit;
providing a step signal at time t0;
receiving a response signal at time t1;
measuring a time delay between t0 and t1 and designating the measured time delay as a circuit delay; and
correlating the circuit delay to within one of four predetermined time delay intervals each having a respective loop-delay compensation circuit coefficient value.

25. A method for automatically adjusting the performance of a sigma-delta modulated analog-to-digital converter having a loop-delay compensation circuit, comprising:
setting a loop-delay compensation circuit coefficient to a first value;
determining the signal-to-noise-plus-distortion ratio (SNDR1) of the analog-to-digital converter;

setting the loop-delay compensation circuit coefficient to a second value, different from the first value;

determining the signal-to-noise-plus-distortion ratio (SNDR2) of the analog-to-digital converter; and setting the loop-delay compensation circuit coefficient to one of the first or second loop-delay compensation circuit coefficient values having the highest corresponding signal-to-noise-plus-distortion ratio.

26. A method for selecting a loop-delay compensator coefficient for improving the performance of a sigma-delta modulated analog-to-digital converter, comprising:

receiving and storing two loop-delay compensator coefficient values;

providing to a loop-delay compensator circuit each of the two loop-delay compensator coefficient values in turn and determining the signal-to-noise-plus-distortion-ratio of the analog-to-digital converter for each of the two loop-delay compensator coefficient values, respectively; and retrieving the sigma-delta loop-delay compensator coefficient value that corresponds to the highest determined signal-to-noise-plus-distortion ratio.

27. A sigma-delta modulated analog-to-digital converter, comprising:

a sigma-delta modulator having a first integrator having a first changeable coefficient, wherein the first changeable coefficient is controlled by a first selectable coefficient signal;

a loop-delay compensator circuit in communication with the sigma-delta modulator and having a second changeable coefficient, wherein the second changeable coefficient is controlled by a second selectable coefficient signal; and a processor in communication with the first integrator and configured to generate the first selectable coefficient signal, the first selectable coefficient signal selected from at least two integrator signals, measure a loop-delay of the sigma-delta modulator, and generate the second selectable coefficient signal, the second selectable coefficient signal selected from at least two loop-delay signals.

28. The sigma-delta modulated analog-to-digital converter of claim 27 wherein the processor is a digital signal processor.

29. The sigma-delta modulated analog-to-digital converter of claim 28 wherein the digital signal processor includes a digital spectrum analyzer.

30. The sigma-delta modulated analog-to-digital converter of claim 28 wherein the processor is selected from a group consisting of: a hardwired processor, a software processor, a programmable gate array, a microprocessor, and a dedicated processor.

31. The sigma-delta modulated analog-to-digital converter of claim 28 further having a second and a third integrator in communication with the first integrator.

32. The sigma-delta modulated analog-to-digital converter of claim 28 wherein the first selectable coefficient signal corresponds to one of four selectable values.

33. A sigma-delta modulated analog-to-digital converter, comprising:

a sigma-delta modulator having a first integrator having a first changeable coefficient, wherein the first changeable coefficient is controlled by a first selectable coefficient signal;

a loop-delay compensator circuit in communication with the sigma-delta modulator and having a second changeable coefficient, wherein the second changeable coefficient is controlled by a second selectable coefficient signal; and a processor in communication with the first integrator and configured to generate the first selectable coefficient signal, the first selectable coefficient signal selected from at least two integrator signals, measure a step response of the sigma-delta modulator, and generate the second selectable coefficient signal, the second selectable coefficient signal selected from at least two loop-delay signals, wherein the first selectable coefficient signal corresponds to one of four selectable values, and wherein the four selectable values include multiplication factors, each within the range of approximately 0.0 dBFS to -0.4 dBFS.

34. A method for automatically adjusting the performance of a sigma-delta modulated analog-to-digital converter having a loop-delay compensation circuit, comprising:

setting a sigma-delta modulator first integrator coefficient to a first value;

providing a signal for automatically adjusting the sigma-delta modulator first integrator coefficient to a second value in response to a determination that a first integrator output waveform is clipped;

measuring a loop-delay of the analog-to-digital converter;

associating the measured loop-delay with one of at least two predetermined and non-overlapping delay intervals; and setting a loop-delay compensation circuit coefficient based upon the one associated delay interval.

35. The method of claim 34 further comprising:

setting a switch in communication with a capacitive network to a first position to set the sigma-delta modulator first integrator coefficient to the first value; and switching the switch to a second position to adjust the sigma-delta modulator first integrator coefficient to the second value.

36. The method of claim 35 further comprising:

receiving an output signal from the sigma-delta modulated analog-to-digital converter and determining, based upon a shape of the output signal, whether the first integrator output waveform is clipped.

37. The method of claim 34 further comprising:

open circuiting the sigma-delta modulated analog-to-digital converter prior to measuring the loop-delay.

* * * * *